(12) United States Patent
Sunohara et al.

(10) Patent No.: US 8,003,895 B2
(45) Date of Patent: Aug. 23, 2011

(54) ELECTRONIC PARTS PACKAGING STRUCTURE AND METHOD OF MANUFACTURING THE SAME

(75) Inventors: Masahiro Sunohara, Nagano (JP); Kei Murayama, Nagano (JP); Hiroyuki Kato, Nagano (JP); Syoji Watanabe, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 30 days.

(21) Appl. No.: 12/457,324

(22) Filed: Jun. 8, 2009

(65) Prior Publication Data

US 2009/0250257 A1 Oct. 8, 2009

Related U.S. Application Data

(62) Division of application No. 11/898,554, filed on Sep. 13, 2007, now Pat. No. 7,563,987, which is a division of application No. 11/090,028, filed on Mar. 28, 2005, now Pat. No. 7,285,728.

(30) Foreign Application Priority Data

Mar. 29, 2004 (JP) .................................. 2004-096660

(51) Int. Cl.
*H05K 1/16* (2006.01)
(52) U.S. Cl. ........................................ 174/260; 174/262
(58) Field of Classification Search .................. 174/260, 174/261, 262
See application file for complete search history.

(56) References Cited

U.S. PATENT DOCUMENTS

| 5,432,677 | A | 7/1995 | Mowatt et al. ................. 361/719 |
| 6,038,133 | A | 3/2000 | Nakatani et al. .............. 361/760 |
| 6,329,610 | B1 | 12/2001 | Takubo et al. ................. 174/264 |
| 6,538,210 | B2 | 3/2003 | Sugaya et al. ................. 174/258 |
| 6,724,638 | B1* | 4/2004 | Inagaki et al. ................. 361/763 |
| 6,742,250 | B2 | 6/2004 | Takahashi ........................ 29/847 |
| 6,822,170 | B2 | 11/2004 | Takeuchi et al. .............. 174/258 |
| 6,841,740 | B2 | 1/2005 | Ogawa et al. .................. 174/256 |
| 6,876,091 | B2 | 4/2005 | Takeuchi et al. .............. 257/793 |
| 6,876,554 | B1 | 4/2005 | Inagaki et al. ................. 361/763 |
| 6,909,054 | B2* | 6/2005 | Sakamoto et al. ............. 174/260 |
| 6,914,322 | B2 | 7/2005 | Iijima et al. .................... 257/678 |
| 6,930,392 | B2 | 8/2005 | Sunohara et al. .............. 257/758 |
| 2004/0014317 | A1 | 1/2004 | Sakamoto et al. ............. 438/689 |

FOREIGN PATENT DOCUMENTS

| JP | 2000-323645 | 11/2000 |
| JP | 2002-170840 | 6/2002 |

* cited by examiner

*Primary Examiner* — Ishwarbhai B Patel
(74) *Attorney, Agent, or Firm* — Kratz, Quintos & Hanson, LLP

(57) ABSTRACT

An electronic parts packaging structure of the present invention includes a core substrate having such a structure that a recess portion is provided by forming a prepreg insulating layer having an opening portion therein on a resin layer, and an electronic parts mounted on a bottom portion of the recess portion of the core substrate such that a connection pad of the electronic parts is directed upward, and also, such a structure may be employed that the electronic parts is embedded in a resin layer of a core substrate having a structure that the resin layer is formed on the prepreg insulating layer.

3 Claims, 14 Drawing Sheets

PRIOR ART

ELECTRONIC PARTS PACKAGING STRUCTURE AND METHOD OF MANUFACTURING THE SAME

RELATED APPLICATIONS

This application is a division of U.S. patent application Ser. No. 11/898,554, filed on Sep. 13, 2007 now U.S. Pat. No. 7,563,987, which application is a division of Ser. No. 11/090,028, now U.S. Pat. No. 7,285,728, filed on Mar. 28, 2005, which application claims priority of Japanese Patent Application No. 2004-096660 filed on Mar. 29, 2004, the entire contents of which are incorporated herein by reference.

BACKGROUND OF THE INVENTION

1. Field of the Invention

The present invention relates to an electronic parts packaging structure and a method of manufacturing the same and, more particularly, an electronic parts packaging structure capable of dealing easily with a reduction in thickness and a method of manufacturing the same.

2. Description of the Related Art

The development of the LSI technology as the key technology to actualize the multimedia device is proceeding steadily toward the higher speed and the larger capacity of the data transmission. Following this trend, the packaging technology serving as the interface between the LSI and the electronic device is advanced toward the higher density.

For instance, in Patent Literature 1 (Patent Application Publication (KOKAI) 2002-170840), it is set forth that, in order to connect electrically the printed-wiring board and the semiconductor chip without the intervention of the lead parts, the semiconductor chip is mounted in the recess portion of the integral type core substrate, in which the recess portion is provided, and then the multi-layered wiring that is connected to the semiconductor chip is formed thereon.

Also, in Patent Literature 2 (Patent Application Publication (KOKAI) 2000-323645), the semiconductor device having such a structure that a plurality of semiconductor chips are mounted three-dimensionally on the circuit board in a state that they are embedded in the insulating layer and a plurality of semiconductor chips are connected mutually via the wiring pattern, which is formed in a multi-layered fashion via the insulating layers, is set forth.

Meanwhile, in the semiconductor device in which the semiconductor chips are stacked three-dimensionally on the circuit board, the reduction of the total thickness as well as the miniaturization is requested.

In above Patent Literatures 1 and 2, no consideration is given to the reduction of the total thickness of the semiconductor device.

SUMMARY OF THE INVENTION

It is an object of the present invention to provide an electronic parts packaging structure capable of dealing easily with a reduction in thickness and a method of manufacturing the same.

The present invention is concerned with an electronic parts packaging structure which comprises a core substrate consisting of a resin layer and a prepreg insulating layer formed on the resin layer to have an opening portion therein, whereby a recess portion is provided by the opening portion in the prepreg insulating layer; and an electronic parts mounted on the resin layer in the recess portion of the core substrate such that a connection pad of the electronic parts is directed upward.

In the present invention, the core substrate is composed of a resin layer and prepreg insulating layer in which the opening portion is provided on the resin layer, and the recess portion is provided in the core substrate by the opening portion of the prepreg insulating layer. The prepreg insulating layer is formed by curing the prepreg that a resin is impregnated with a glass cloth, or the like. The electronic parts is mounted on the bottom portion of the recess portion of the core substrate in a state that the connection pad of the electronic parts is directed upward.

In the present invention, the electronic parts is mounted in the core substrate and thus a thickness of the electronic parts can be eliminated. Therefore, a thickness of the electronic parts does not have an influence on an overall thickness of the packaging structure, and a thickness reduction of the electronic parts packaging structure can be attained.

In addition, the core substrate can be obtained by adhering the prepreg, in which the opening portion is provided previously, on the resin. Therefore, the core substrate can be manufactured by a very simple method at a low cost in contrast to the case where the recess portion is formed on the plate-like core substrate by the router, or the like (Patent Literature 1).

Also, the present invention is concerned with an electronic parts packaging structure which comprises a core substrate consisting of a prepreg insulating layer and a resin layer formed on the prepreg insulating layer; and an electronic parts embedded in the resin layer of the core substrate such that a connection pad of the electronic parts is directed upward.

In the present invention, the core substrate is composed of the prepreg insulating layer and the resin layer formed thereon, and the electronic parts is embedded in the resin layer of the core substrate such that the connection pad of the electronic parts is directed upward.

By doing this, the electronic parts is embedded in the resin layer constituting the core substrate to eliminate a thickness of the electronic parts. Therefore, the reduction in thickness of the electronic parts packaging structure can be achieved.

In the preferred mode of the present invention, a wiring pattern connected electrically to a connection pad of the electronic parts is formed over the core substrate and the electronic parts. Also, an upper electronic parts is flip-chip connected to an uppermost wiring pattern. In addition, a wiring pattern connected to the connection pad of the electronic parts is connected electrically to the wiring pattern formed on the lower surface side of the core substrate via a via hole that passes through the core substrate. Further, a connection portion to which an external connection terminal is connected is provided on a lowermost wiring pattern formed on a lower surface side of the core substrate.

Alternately, the one side packaging using only one side of the core substrate may be employed, and also the connection portion to which the external connection terminal whose height is higher than a height of the upper electronic parts is connected may be provided on the uppermost wiring pattern near the outside of the upper electronic parts. In the case of this mode, since there is no need to lead the wiring pattern to the outside area of the electronic parts, an area of the electronic parts packaging structure can be reduced rather than the case where the external connection terminal is provided on the lower surface side of the core substrate.

Also, the connection pad arranged in a peripheral mode and a passivating film for exposing the connection pad are provided on a surface of the electronic parts, and the wiring pattern is connected directly to the connection pad of the electronic parts while contacting the passivating film and is formed to extend from the connection pad to an outside of the electronic parts.

In the case of this mode, since there is no need to form the via hole on the connection pad of the electronic parts, there is no possibility that the electronic parts is damaged by the laser. In addition, even though an insulation resistance of the passivating film of the electronic parts is low, it is not possible that the wiring pattern and the electric circuit of the electronic parts are short-circuited electrically because the wiring pattern is not arranged in the center portion of the electronic parts.

Also, the present invention is concerned with a method of manufacturing an electronic parts packaging structure, which comprises the steps of arranging a prepreg having an opening portion therein on a resin layer, and then applying a heat and a pressure to adhere the prepreg on the resin layer, whereby a core substrate having such a structure that a recess portion is provided by the opening portion is obtained; and mounting an electronic parts on the resin layer in the recess portion of the core substrate such that a connection pad of the electronic parts is directed upward.

Also, the present invention is concerned with a method of manufacturing an electronic parts packaging structure, which comprises the steps of arranging a prepreg on a resin layer and arranging an electronic parts on the resin layer such that a connection pad of the electronic parts is directed upward; and applying a heat and a pressure to the prepreg, the resin layer, and the electronic parts to adhere the prepreg on the resin layer and to embed and mount the electronic parts in the resin layer.

By using the manufacturing method of the present invention, a production efficiency can be improved remarkably rather than the case where the recess portion is formed by processing the plate-like core substrate by means of the router, and thus the above electronic parts packaging structure can be manufactured at a low cost.

As described above, since the electronic parts can be mounted in the core substrate by a very simple method, the present invention can respond easily to the thickness reduction of the electronic parts packaging structure.

DETAILED DESCRIPTION OF THE PREFERRED EMBODIMENTS

Embodiments of the present invention will be explained with reference to the accompanying drawings hereinafter.

Figure 1:
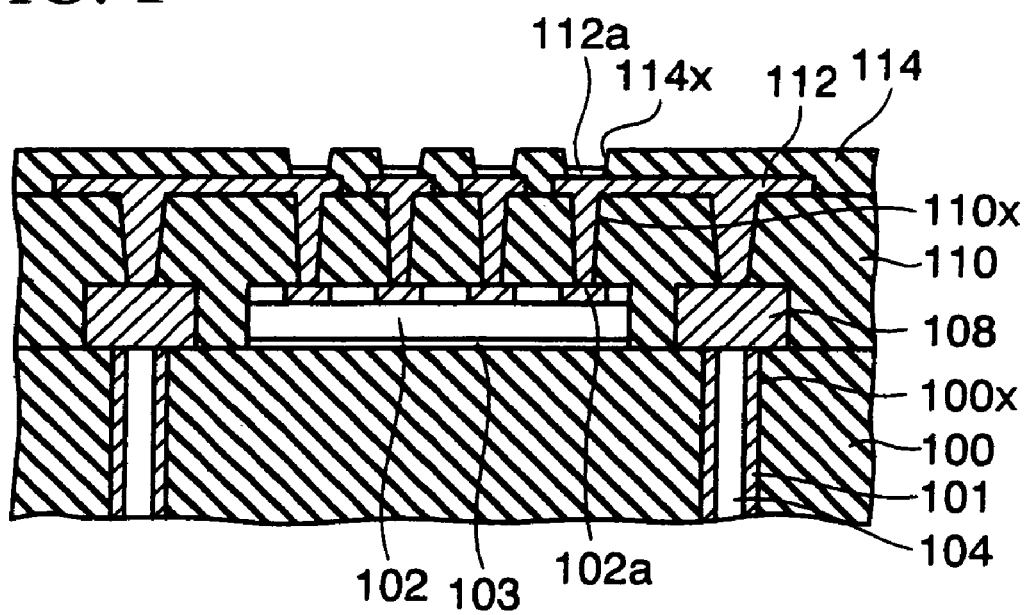
FIG. 1 is a sectional view showing an electronic parts packaging structure according to the related art.

Prior to the explanation of the embodiments of the present invention, an electronic parts packaging structure having a structure in which electronic parts are mounted on a core substrate in a condition that they are embedded in an insulating film will be explained hereunder. FIG. 1 is a sectional view showing an electronic parts packaging structure according to the related art.

As shown in FIG. 1, in the electronic parts packaging structure in the related art, a semiconductor chip 102 whose connection pads 102a are directed upward (face up) is secured on a core substrate 100 via an adhesive layer 103. Through holes 100x are provided in the core substrate 100, and a through-hole conductive layer 101 is formed on inner surfaces of the through holes respectively. A resin body 104 is filled in the through holes 100x respectively.

First wiring patterns 108 connected to the through-hole conductive layers 101 are formed on an upper surface of the core substrate 100. A film thickness of the first wiring pattern 108 agrees with a thickness of the semiconductor chip 102 to eliminate a level difference of the semiconductor chip 102.

Also, an interlayer insulating film 110 is formed on the semiconductor chip 102 and the first wiring patterns 108 such that the semiconductor chip 102 is embedded in the interlayer insulating film 110. A via hole 110x is formed in the interlayer insulating film 110 on the connection pads 102a of the semiconductor chip 102 and the first wiring patterns 108 respectively. Second wiring patterns 112 each connected to the connection pad 102a of the semiconductor chip 102 and the first wiring pattern 108 via the via hole 110x are formed on the interlayer insulating film 110.

Also, a solder resist 114 in which an opening portion 114x is provided on predetermined portions of the second wiring patterns 112 respectively is formed, and then a connection portion 112a made of an Ni/Au plating layer is formed on portions of the second wiring patterns 112, which are exposed from the opening portions 114x. Then, an upper semiconductor chip (not shown) is flip-chip mounted on the connection portions 112a. Also, a build-up wiring layer (not shown) is formed on the lower surface side of the core substrate 100, and external connection terminals are provided on the lowermost wiring layer.

In the electronic parts packaging structure in the related art, since the semiconductor chip 102 is mounted on the core substrate 100 a thickness of which is relatively thick (200 μm or more), there exists such a problem that the above packaging structure cannot easily deal with a reduction in a thickness of the packaging structure. Further, since the film thickness of the first wiring pattern 108 must be set to coincide with the thickness of the semiconductor chip 102 to eliminate the level difference of the semiconductor chip 102, there still remains such a problem that a processing time in the electroplating applied to form the wiring patterns is extended and thus a production efficiency becomes poor.

Electronic parts packaging structures in embodiments of the present invention explained subsequently can not only overcome above problems but also deal with a thickness reduction by a simple manufacturing method.

First Embodiment

Figure 2A:
FIGS. 2A to 2O are sectional views showing a method of manufacturing an electronic parts packaging structure according to a first embodiment of the present invention.
Figure 2B:
Figure 2C:
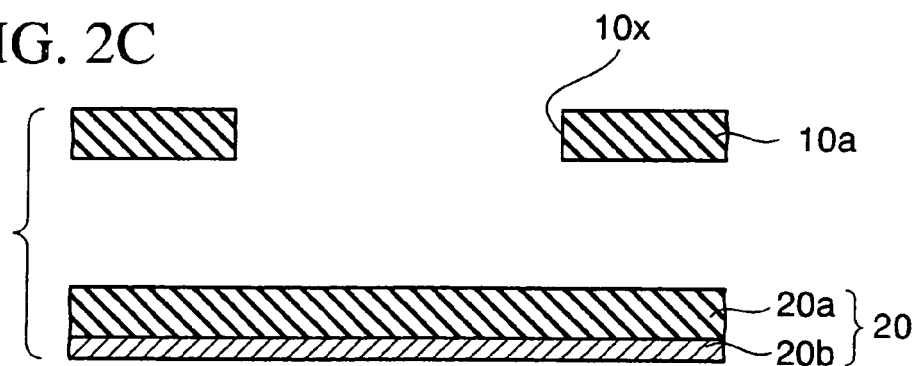
Figure 2D:
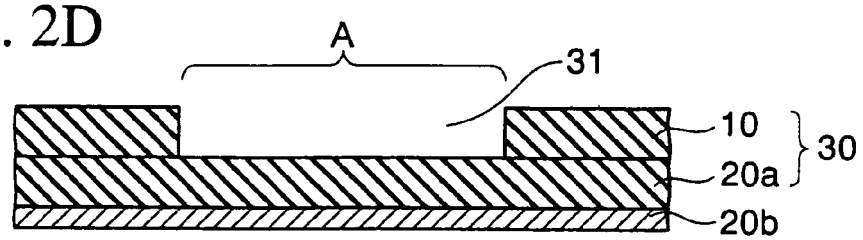
Figure 2E:
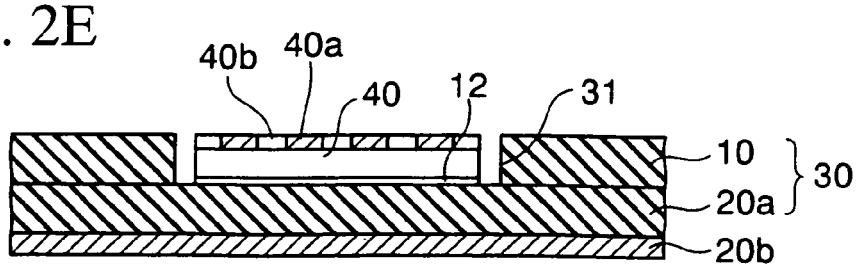
Figure 2F:
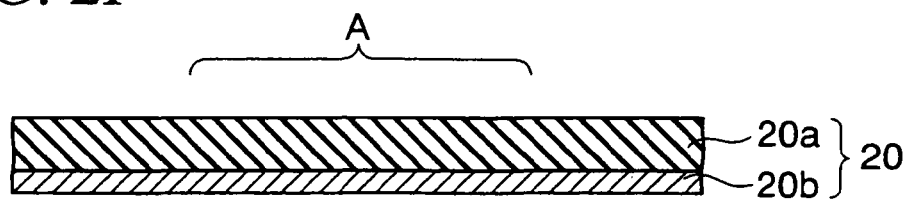
Figure 2G:
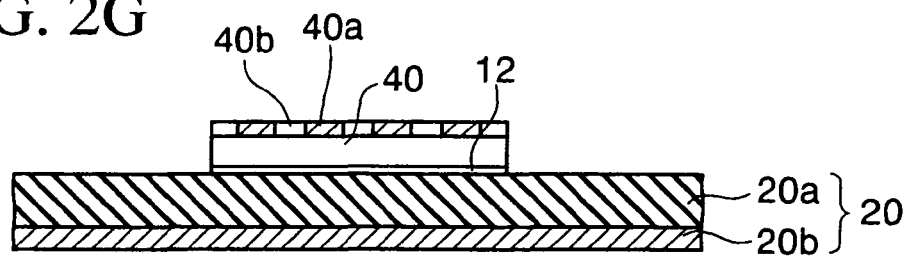
Figure 2H:
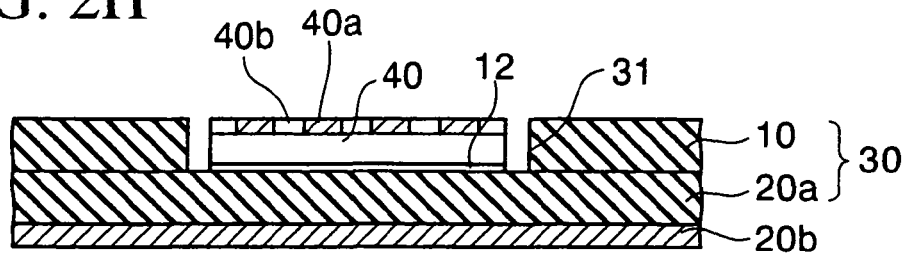
Figure 2I:
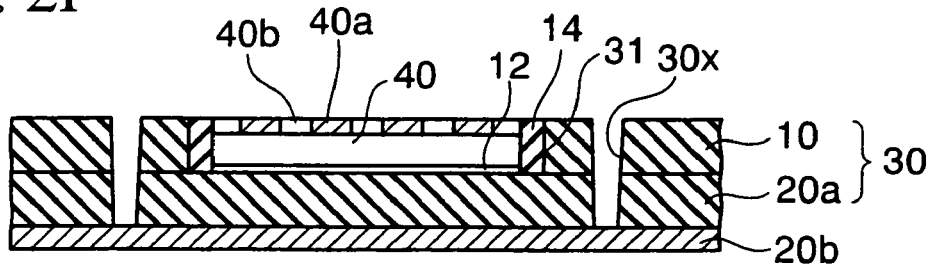
Figure 2J:
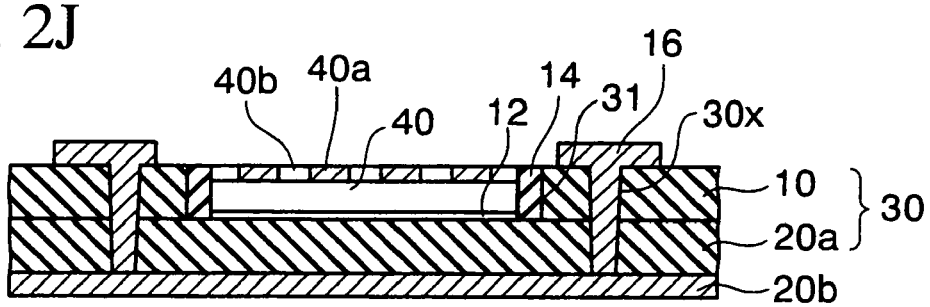
Figure 2K:
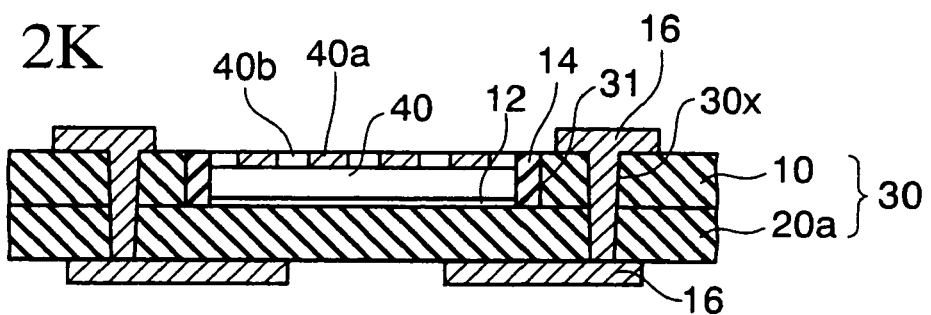
Figure 2L:
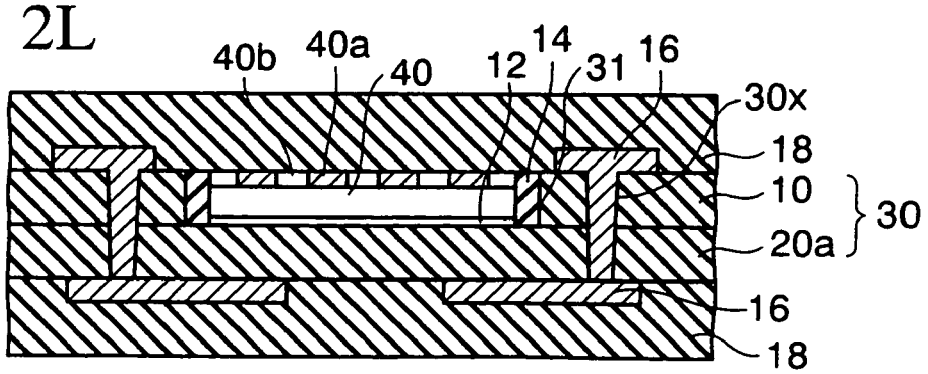
Figure 2M:
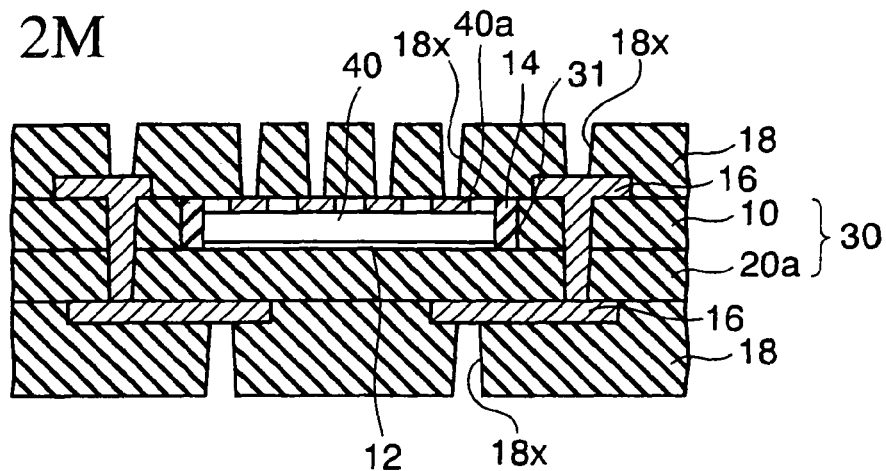
Figure 2N:
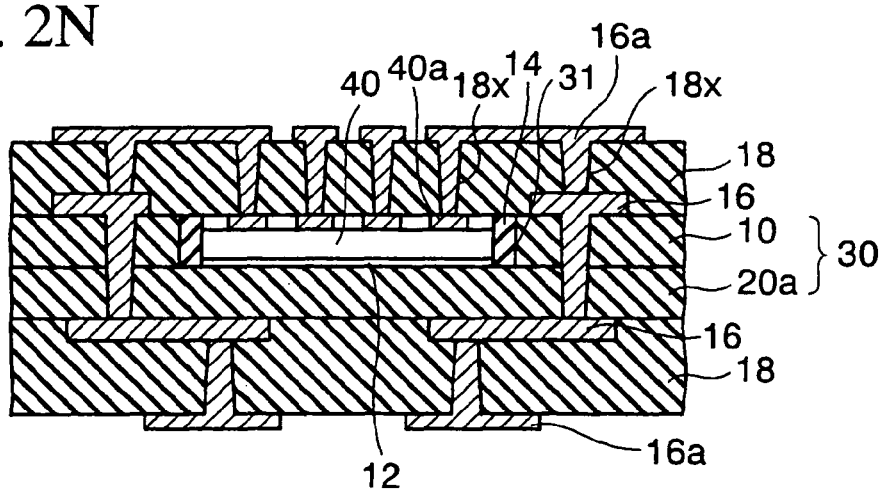
Figure 2O:
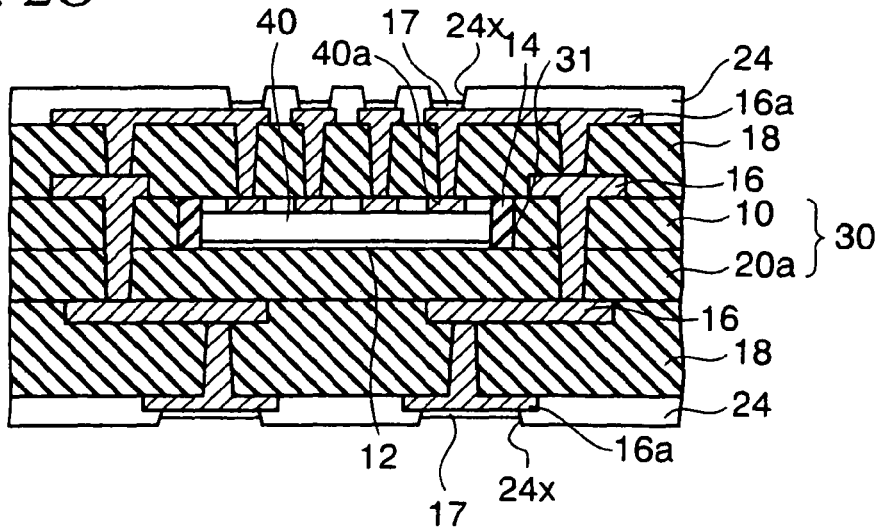
Figure 3:
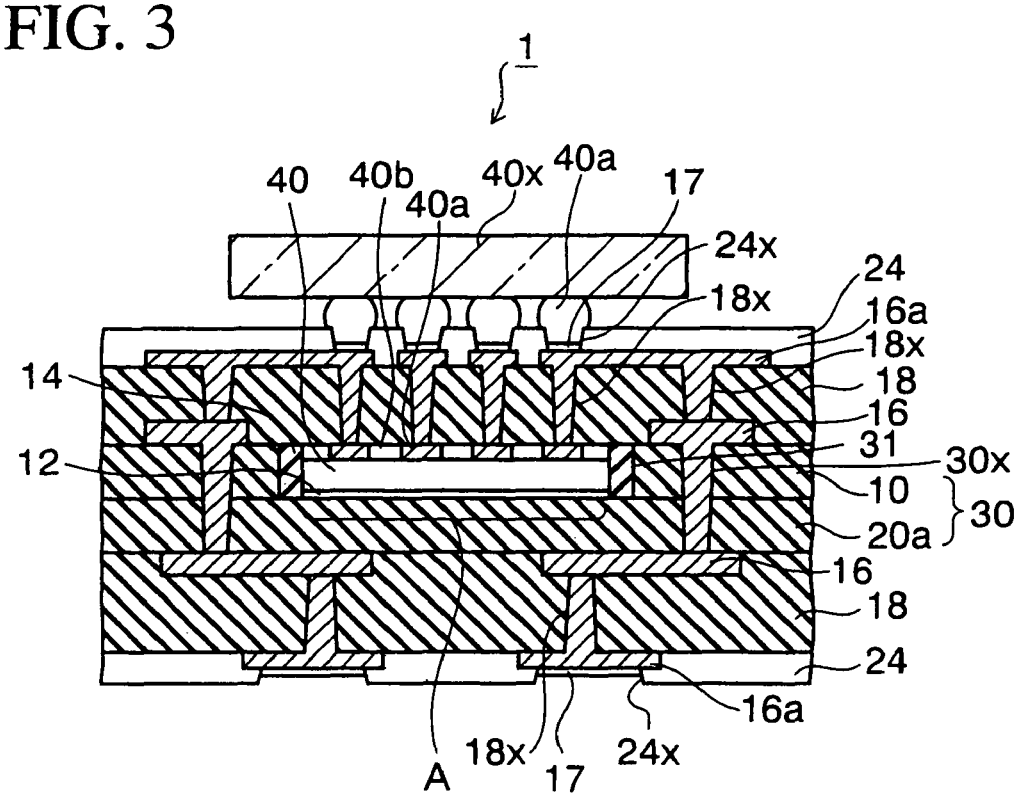
FIG. 3 is a sectional view showing the electronic parts packaging structure according to the first embodiment of the present invention.

FIGS. 2A to 2O are sectional views showing a method of manufacturing an electronic parts packaging structure according to a first embodiment of the present invention, and FIG. 3 is a sectional view showing the same electronic parts packaging structure. In the method of manufacturing the electronic parts packaging structure in the first embodiment, as shown in FIG. 2A, first a prepreg 10a that a resin such as an epoxy resin, or the like is impregnated with a glass cloth, an aramid fiber, or the like is prepared. The prepreg in the B-stage (semi-cured state) is used as the prepreg 10a.

Then, as shown in FIG. 2B, a predetermined portion of the prepreg 10a is punched out by the stamping. Thus, an opening portion 10x is formed in the prepreg 10a.

Then, as shown in FIG. 2C, a resin layer 20 with a copper foil having the structure that a copper foil 20b is pasted on one side of a resin layer 20a is prepared. Then, the prepreg 10a in which the opening portion 10x is provided is arranged on the exposed surface of the resin layer 20a out of the resin layer 20 with the copper foil, and then the prepreg 10a and the resin layer 20a are cured and adhered together by applying the heat and the pressure. Thus, as shown in FIG. 2D, a prepreg insulating layer 10 having the opening portion 10x therein is formed on the resin layer 20 with the copper foil, and a core substrate 30 consisting of the resin layer 20a and the prepreg insulating layer 10 is obtained. In other words, a recess portion 31 in which a semiconductor chip is mounted is provided on the core substrate 30, and a portion of the resin layer 20a, which is exposed from the recess portion 31, serves as a mounting area A.

In the case where the recess portion is formed on the plate-like core substrate by using the router, a relatively wide area must be processed while scanning the router, unlike the present embodiment. Therefore, there exist the problems that the processing time is prolonged and the production efficiency becomes bad.

However, in the present embodiment, the core substrate 30 in which the recess portion 31 is provided can be easily obtained by adhering the prepreg 10a having the opening portion 10x therein on the resin layer 20a. Therefore, the production efficiency can be improved remarkably rather than the case where the router is used.

Then, as shown in FIG. 2E, a semiconductor chip 40 having the structure that connection pads 40a and passivating films 40b are exposed on an element forming surface is prepared. Then, the semiconductor chip 40 is secured on the mounting area A in the recess portion 31 of the core substrate 30 by an adhesive layer 12 in a state that the connection pads 40a are directed upward (face up). At this time, preferably a depth of the recess portion 31 (corresponding to a thickness of the prepreg 10a) is set to coincide with a thickness of the semiconductor chip 40 such that an upper surface of the semiconductor chip 40 becomes equal in height to an upper surface of the core substrate 30.

Alternately, as a variation to get the structural body in FIG. 2E, as shown in FIGS. 2F and 2G, first the semiconductor chip 40 is secured on a portion of the resin layer 20 with the copper foil, which serves as the mounting area A, by the adhesive layer 12 to direct the connection pads 40a upward. Then, as shown in FIG. 2H, the prepreg 10a in which the opening portion 10x is provided in an area of the resin layer 20a corresponding to the mounting area A, in which the semiconductor chip 40 is mounted, is arranged on the resin layer 20 with the copper foil, and then the prepreg 10a and the resin layer 20a are cured and adhered together by applying the heat and the pressure. Thus, as shown in FIG. 2H, the same structural body as that in FIG. 2E can be obtained.

With this arrangement, the thickness of the semiconductor chip 40 is contained in the thickness of the core substrate 30 and is eliminated. As a result, the thickness of the semiconductor chip 40 has no influence on an overall thickness of the packaging structure.

In this event, the semiconductor chip 40 is illustrated as an example of the electronic parts, but various electronic parts such as a capacitor parts, etc. may be employed.

Then, as shown in FIG. 2J, a filling resin 14 is filled in a clearance between the semiconductor chip 40 and side surfaces of the recess portion 31 of the core substrate 30 to planarize the upper surface. Then, the core substrate 30 (the prepreg insulating layer 10 and the resin layer 20a) is processed by the laser, or the like. Thus, first via holes 30x that pass through the core substrate 30 and have a depth reaching the copper foil 20b are formed.

Then, as shown in FIG. 2J, first wiring patterns 16 that are connected to the copper foil 20b via the first via hole 30x respectively are formed on the upper surface of the core substrate. The first wiring patterns 16 are formed by the semi-additive process, for example.

In more detail, first a seed layer (not shown) is formed on the core substrate 30, the semiconductor chip 40, and inner surfaces of the first via holes 30x by the sputter method or the electroless plating. Then, a resist film (not shown) in which opening portions are provided in portions that correspond to the first wiring patterns 16 is formed. Then, metal film patterns (not shown) are formed in the opening portions of the resist film by the electroplating utilizing the seed layer as the plating power-feeding layer. Then, the resist film is removed and then the first wiring patterns 16 are obtained by etching the seed layer while using the metal film patterns as a mask. The seed layer is etched selectively with respect to the connection pads 40a of the semiconductor chip 40. In this case, the subtractive process, the full-additive process, and the like may be employed in addition to the semi-additive process.

Then, as shown in FIG. 2K, the copper foil 20b formed on the lower surface of the core substrate 30 is patterned. Thus, the first wiring patterns 16 are also formed on the lower surface of the core substrate 30.

Then, as shown in FIG. 2L, a resin film, or the like is pasted on both surface sides of the core substrate 30 respectively. Thus, an interlayer insulating film 18 for covering the first wiring patterns 16 is formed on both surfaces of the core substrate 30 respectively. In the case where the clearance between the semiconductor chip 40 and side surfaces of the recess portion 31 of the core substrate 30 can be filled with the interlayer insulating film 18 to get the flat upper surface, the above filling resin 14 may be omitted.

Then, as shown in FIG. 2M, the interlayer insulating film 18 on both surface sides of the core substrate 30 is processed by the laser, or the like respectively. Thus, second via holes 18x each having a depth that reaches the connection pad 40a of the semiconductor chip 40 or the first wiring pattern 16 are formed respectively.

Then, as shown in FIG. 2N, second wiring patterns 16a each connected to the connection pad 40a of the semiconductor chip 40 or the first wiring pattern 16 via the second via hole 18x are formed on the interlayer insulating film 18 on both surface sides of the core substrate 30 respectively.

In the present embodiment, such a mode is illustrated that two-layered wiring patterns 16, 16a are formed on both surface sides of the core substrate 30 respectively. But such a mode may be employed that n-layered (n is an integer that is 1 or more) wiring patterns are formed on both surface sides of the core substrate 30 respectively.

Then, as shown in FIG. 2O, a solder resist film 24 in which opening portions 24x are provided on predetermined portions of the second wiring patterns 16a is formed on both surface sides of the core substrate 30 respectively. Then, the Ni/Au plating is applied selectively to portions of the second wiring patterns 16a in the opening portions 24x of the solder resist film 24 on both surface sides of the core substrate 30. Thus, a connection portion 17 is formed on the portions of the second wiring patterns 16a respectively.

Then, as shown in FIG. 3, bumps 40a of an upper semiconductor chip 40x (upper electronic parts) are flip-chip connected to the connection portions 17 on the second wiring patterns 16a over the core substrate 30. Thus, an electronic parts packaging structure 1 in the first embodiment is obtained.

In the electronic parts packaging structure 1 in the first embodiment, as shown in FIG. 3, the core substrate 30 is composed of the resin layer 20a and the prepreg insulating layer 10 in which the opening portions 10x are provided and as a result the recess portion 31 is provided on the core substrate 30. Then, the semiconductor chip 40 is secured and mounted on the mounting area A on the bottom surface of the recess portion 31 of the core substrate 30 by the adhesive layer 12 in a state that the connection pads 40a are directed upward. That is, the semiconductor chip 40 is embedded and arranged in the core substrate 30 that is composed of the resin layer 20a and the prepreg insulating layer 10, and thus a structure in which the thickness of the semiconductor chip 40 is eliminated can be achieved.

Also, the first via holes 30x that pass through the core substrate are formed in the core substrate 30, and the first wiring patterns 16 connected mutually via the first via holes 30x are formed on both surface sides of the core substrate 30 respectively.

Also, the interlayer insulating film 18 for covering the first wiring patterns 16 is formed on both surfaces of the core substrate 30 respectively. The second via holes 18x each having a depth that reaches the connection pad 40a of the semiconductor chip 40 or the first wiring pattern 16 are formed in the interlayer insulating film 18 over the core substrate 30. Also, the second via holes 18x having a depth reaching the first wiring pattern 16 are formed in the interlayer insulating film 18 under the core substrate 30.

The second wiring patterns 16a each connected to the connection pad 40a of the semiconductor chip 40 and the first wiring pattern 16 via the second via hole 18x are formed on the interlayer insulating film 18 over the core substrate 30. Also, the second wiring patterns 16a each connected to the first wiring pattern 16 via the second via hole 18x are formed on the interlayer insulating film 18 under the core substrate 30.

In addition, the solder resist film 24 in which the opening portions 24x are provided on the predetermined portions of the second wiring patterns 16a is formed on the second wiring patterns 16a and the interlayer insulating film 18 on both surface sides of the core substrate 30 respectively. Then, the connection portion 17 made of the Ni/Au plating layer is formed on the portions of the second wiring patterns 16a in the opening portions 24x of the solder resist film 24 on both surface sides of the core substrate 30 respectively.

Then, the bumps 40a of the upper semiconductor chip 40x are flip-chip connected to the connection portions 17 on the second wiring patterns 16a over the core substrate 30. Also, the connection portions 17 on the second wiring patterns 16a under the core substrate 30 act as the external connection pads. In case the BGA (Ball Grid Array) mode is employed, external connection terminals (not shown) such as solder balls, gold bumps, etc. are provided to the connection portions 17 on the second wiring patterns 16a under the core substrate 30, and then the external connection terminals are connected to the mother board, or the like. Also, in case the LGA (Land Grid Array) mode is employed, the external connection terminals are omitted.

In the first embodiment, since the semiconductor chip 40 is mounted in the recess portion 31 of the core substrate 30 that is composed of the resin layer 20a and the prepreg insulating layer 10, the thickness of the semiconductor chip 40 can be eliminated and also the overall thickness of the packaging structure can be thinned rather than the above related art. Also, unlike the above related art, since there is no need to form the film thickness of the first wiring patterns 16 unnecessarily thick to coincide with the thickness of the semiconductor chip 40, a processing time of the electroplating can be shortened considerably and also reduction in a production cost can be achieved.

Further, the core substrate 30 in which the recess portion 31 is provided can be obtained by adhering the prepreg 10a having the opening portions 10x therein on the resin layer 20a. Therefore, the production efficiency can be improved remarkably rather than the case where the recess portion is formed on the core substrate by the router.

Second Embodiment

Figure 4A:
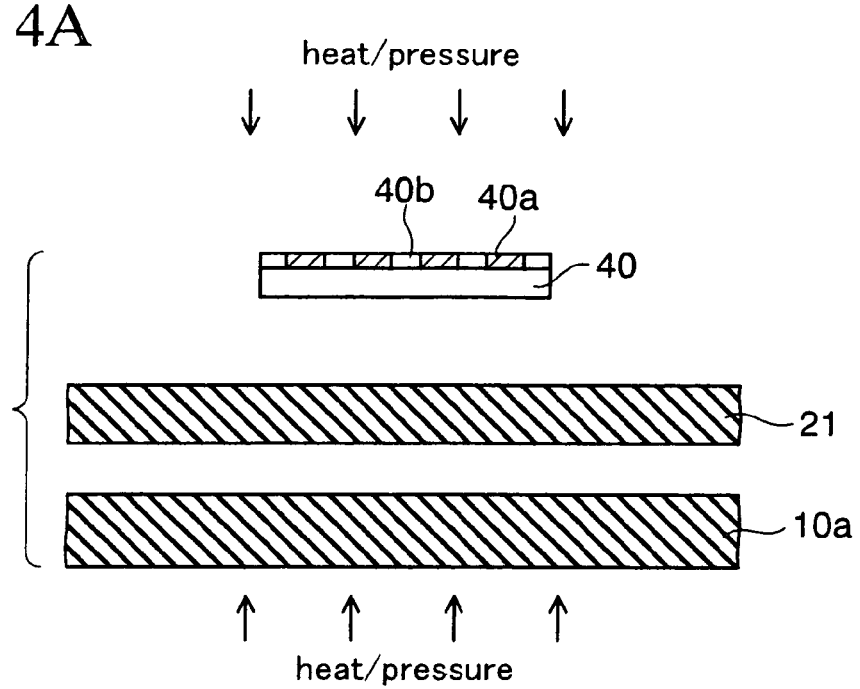
FIGS. 4A to 4F are sectional views showing a method of manufacturing an electronic parts packaging structure according to a second embodiment of the present invention.
Figure 4B:
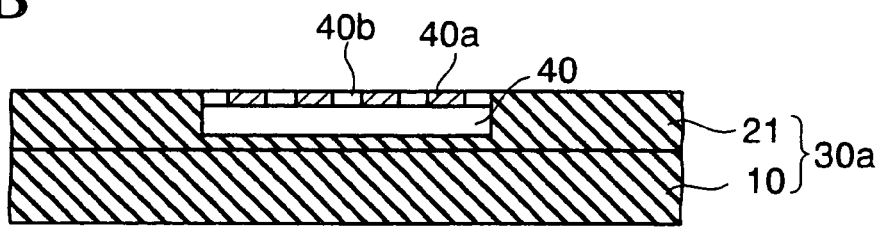
Figure 4C:
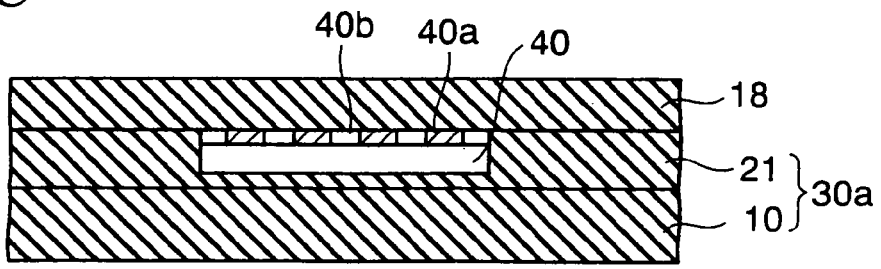
Figure 4D:
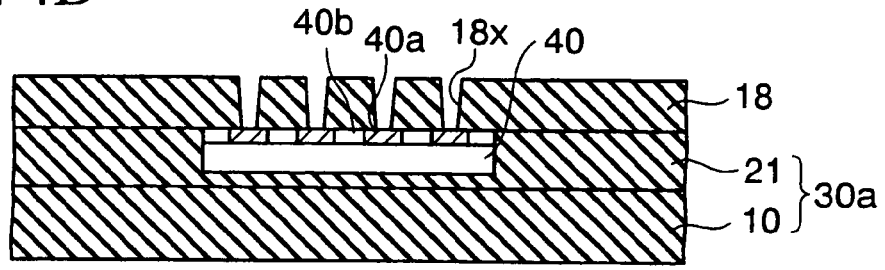
Figure 4E:
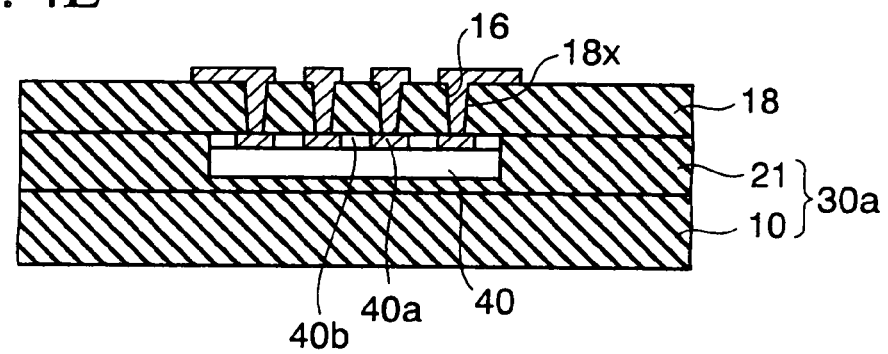
Figure 4F:
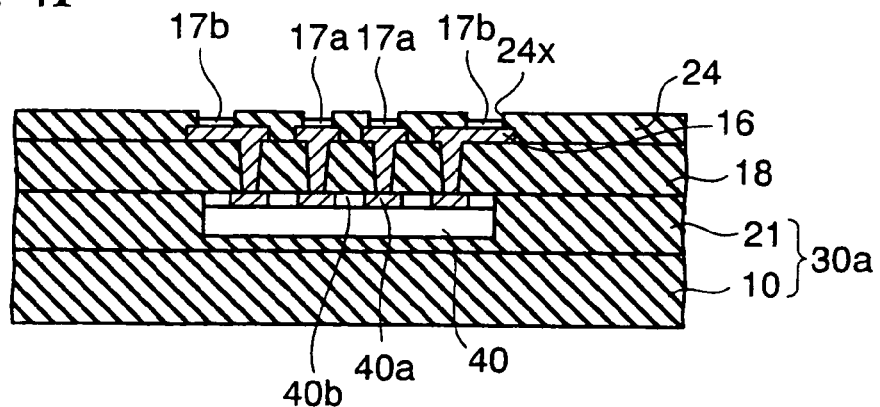
Figure 5:
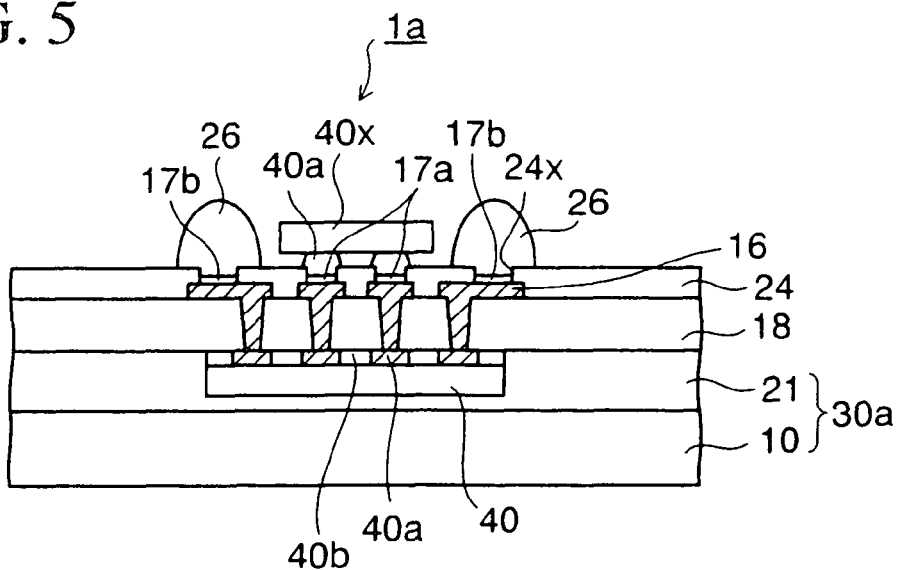
FIG. 5 is a sectional view showing the electronic parts packaging structure according to the second embodiment of the present invention.
Figure 6:
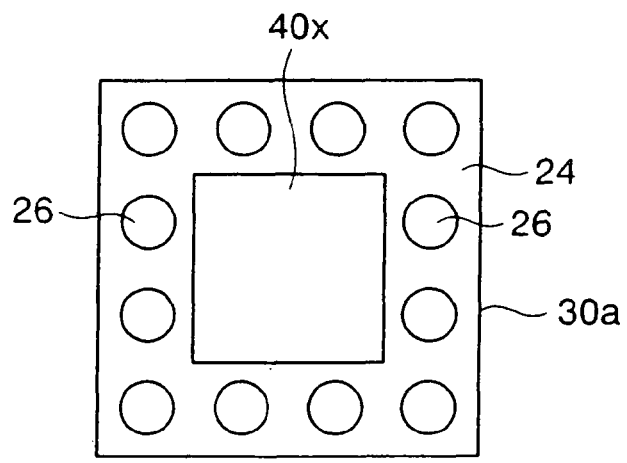
FIG. 6 is a plan view given when the structure in FIG. 5 is viewed from the planar direction.
Figure 7:
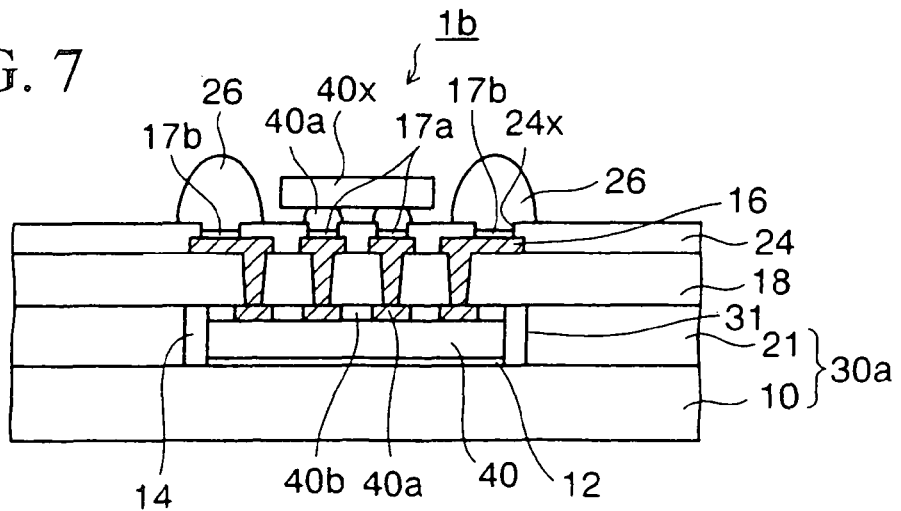
FIG. 7 is a sectional view showing a variation of the electronic parts packaging structure according to the second embodiment of the present invention.

FIGS. 4A to 4F are sectional views showing a method of manufacturing an electronic parts packaging structure according to a second embodiment of the present invention, FIG. 5 is a sectional view showing the electronic parts packaging structure according to the second embodiment of the present invention, FIG. 6 is a plan view given when the structure in FIG. 5 is viewed from the planar direction, and FIG. 7 is a sectional view showing a variation of the electronic parts packaging structure according to the second embodiment of the present invention.

A characteristic feature of the second embodiment resides in that the core substrate is composed of the prepreg and the resin layer formed thereon and also the semiconductor chip is embedded in the resin layer simultaneously when adhering the resin layer on the prepreg. In the second embodiment, detailed explanation of the similar steps to the first embodiment will be omitted herein.

In the method of manufacturing the electronic parts packaging structure in the second embodiment, as shown in FIG. 4, first the prepreg 10a, a resin layer 21 such as an epoxy resin, or the like, and the semiconductor chip 40 (electronic parts) having the structure that the connection pads 40a and the passivating films 40b are exposed on the element forming surface, all being similar to those in the first embodiment, are prepared. Then, the resin layer 21 is arranged on the prepreg 10a and then the semiconductor chip 40 is arranged thereon to direct the connection pads 40a upwardly. Then, the heat and the pressure are applied to this stacked body by the vacuum press under the conditions that the temperature is 110° C. and the pressure is 1 MPa, for example.

At this time, the semiconductor chip 40 is pushed toward the resin layer 21 side and embedded in the resin layer 21 and at the same time the prepreg 10a and the resin layer 21 are cured and the resin layer 21 is adhered to the prepreg 10a. Thus, as shown in FIG. 4B, such a structural body can be obtained that the resin layer 21 is formed on the prepreg insulating layer 10 and the semiconductor chip 40 is embedded in the resin layer 21. In other words, a core substrate 30a is composed of the prepreg insulating layer 10 and the resin layer 21 formed thereon and also the semiconductor chip 40 is embedded in the resin layer 21 of the core substrate 30a.

Accordingly, like the first embodiment, since the semiconductor chip 40 is buried in the core substrate 30a, its thickness can be eliminated. Therefore, the thickness of the semiconductor chip 40 has no influence upon the overall thickness of the packaging structure. At this time, preferably the semiconductor chip 40 is embedded in the resin layer 21 in a state that an upper surface of the semiconductor chip 40 and an upper surface of the resin layer 21 constitute a coplanar surface.

In the second embodiment, since the semiconductor chip 40 is secured when such chip is embedded in the resin layer 21, there is no need to use the adhesive layer unlike the first embodiment and thus a cost reduction can be attained.

Then, as shown in FIG. 4C, the interlayer insulating film 18 is formed on the core substrate 30a and the semiconductor chip 40. Then, as shown in FIG. 4D, the via holes 18x each having a depth that reaches the connection pad 40a of the semiconductor chip 40 are formed by processing the interlayer insulating film 18 by means of the laser, or the like. Then, as shown in FIG. 4E, the wiring patterns 16 each connected to the connection pad 40a of the semiconductor chip 40 are formed on the interlayer insulating film 18 by the semi-additive process explained in the first embodiment, or the like.

In the present embodiment, such a mode is illustrated that single-layer wiring patterns 16 are formed on the upper surface side of the core substrate 30a respectively. But such a mode may be employed that n-layered (n is an integer that is 1 or more) wiring patterns are stacked.

Then, as shown in FIG. 4F, the solder resist film 24 in which the opening portions 24x are provided on predetermined portions of the wiring patterns 16 is formed. Then, the Ni/Au plating is applied selectively to portions of the wiring patterns 16 in the opening portions 24x of the solder resist film 24. Thus, chip connecting portions 17a and external connecting portions 17b are formed. At this time, the chip connecting portions 17a are arranged in the center portion and the external connecting portions 17b are arranged on the peripheral side like a ring.

Then, as shown in FIG. 5, the bumps 40a of the upper semiconductor chip 40x (upper electronic parts) are flip-chip connected to the chip connecting portions 17a located in the center portion of the structural body in FIG. 4F. Then, external connection terminals 26 such as the solder balls, the gold bumps, or the like are formed on the external connecting portions 17b located on the peripheral side of the structural body in FIG. 4F. A height of the external connection terminal 26 is set higher than a height of the upper semiconductor chip 40x. With the above, an electronic parts packaging structure 1a of the second embodiment can be obtained.

In the electronic parts packaging structure 1a of the second embodiment, as shown in FIG. 5, the core substrate 30a is composed of the prepreg insulating layer 10 and the resin layer 21 formed thereon. The semiconductor chip 40 is embedded and mounted in the resin layer 21 constituting the core substrate 30a. The interlayer insulating film 18 in which the via holes 18x are provided on the connection pads 40a of the semiconductor chip 40 is formed on the core substrate 30a and the semiconductor chip 40. The wiring patterns 16 each connected to the connection pad 40a of the semiconductor chip 40 via the via hole 18x are formed on the interlayer insulating film 18.

The solder resist film 24 in which the opening portions 24x are provided on predetermined portions of the wiring patterns 16 is formed on the interlayer insulating film 18. The chip connecting portions 17a and the external connecting portions 17b are provided on the portions of the wiring patterns 16 in the opening portions 24x.

Also, the bumps 40a of the upper semiconductor chip 40x are flip-chip connected to the chip connecting portions 17a arranged in the center portion. Also, the external connection terminals 26 the height of which is set higher than the height of the upper semiconductor chip 40x are provided on the external connecting portions 17b arranged on the peripheral side. Then, the external connection terminals 26 are connected to the mother board, or the like in a condition that the electronic parts packaging structure 1a in FIG. 5 is turned upside down.

When the electronic parts packaging structure 1a in FIG. 5 is viewed from the top side, as shown in FIG. 6, the upper semiconductor chip 40x is flip-chip connected to the center portion of the core substrate 30a and also the external connection terminals 26 are arranged on the peripheral portion of the core substrate 30a like a ring to surround the upper semiconductor chip 40x.

In the electronic parts packaging structure 1a of the second embodiment, the semiconductor chip 40 is embedded in the resin layer 21 of the core substrate 30a. Therefore, the thickness of the semiconductor chip 40 does not affect the overall thickness of the packaging structure, and thus the overall thickness of the electronic parts packaging structure can be reduced like the first embodiment.

Also, in the above first embodiment, the external connection terminals are provided on the opposite surface side of the core substrate 30a to the surface on which the semiconductor chip 40 is mounted. For this reason, the semiconductor chip 40 must be connected electrically to the external connection terminals by extending the wiring patterns 16, 16a from the semiconductor chip 40 to the outside area via the first via holes 30x provided in the core substrate 30a.

Therefore, the outside area must be reserved outside the semiconductor chip 40 to some extent. Thus, the case where this packaging structure cannot easily respond to an area reduction of the electronic parts packaging structure is supposed.

In the second embodiment, the one side packaging mode employing only one side of the core substrate 30a is illustrated. Thus, not only the upper semiconductor chip 40x but also the external connection terminals 26 are provided on the one side surface of the core substrate 30a on which the semiconductor chip 40 is mounted. Therefore, the electrical connection between the semiconductor chip 40 and the external connection terminals 26 can be achieved by not leading the wiring patterns from the semiconductor chip 40 to the outside area but lifting the wiring patterns in close vicinity to the outer periphery of the semiconductor chip 40. As a result, an area of the electronic parts packaging structure 1a can be reduced to the almost same size as the area of the semiconductor chip 40, and thus this embodiment can readily respond to the area reduction of the electronic parts packaging structure 1a.

In this event, like an electronic parts packaging structure 1b in the variation of the second embodiment shown in FIG. 7, in FIG. 5 in the second embodiment, the core substrate 30 in which the recess portion 31 explained in the first embodiment is provided may be employed instead of the core substrate 30a in which the electronic parts 40 is embedded in the resin layer 21, and then the electronic parts 40 may be secured on the bottom portion of the recess portion 31 by the adhesive layer 12. In FIG. 7, since remaining elements are identical to those in FIG. 5, their explanation will be omitted herein.

Also, in the above first embodiment, the core substrate 30a in which the electronic parts 40 is embedded in the resin layer 21 may be employed, as explained in the above second embodiment, and the similar wiring patterns to those in the first embodiment may be formed.

Third Embodiment

Figure 8A:
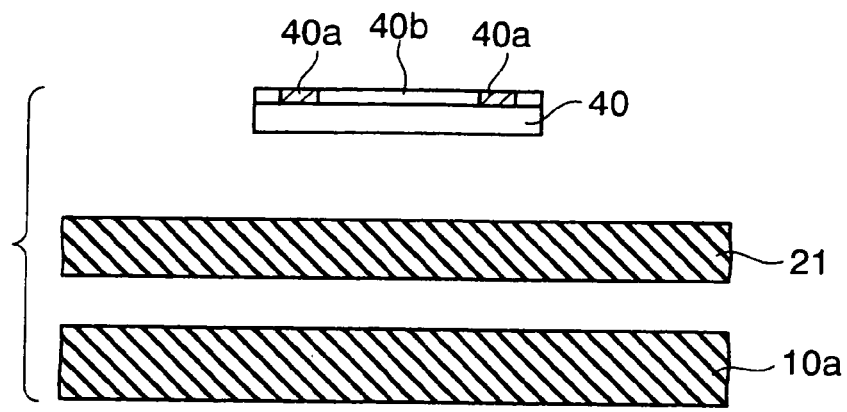
FIGS. 8A to 8H are sectional views showing a method of manufacturing an electronic parts packaging structure according to a third embodiment of the present invention.
Figure 8B:
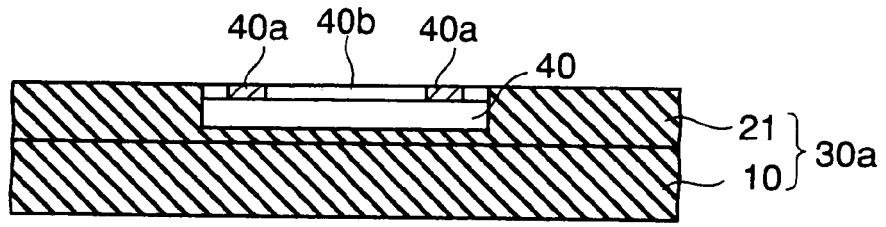
Figure 8C:
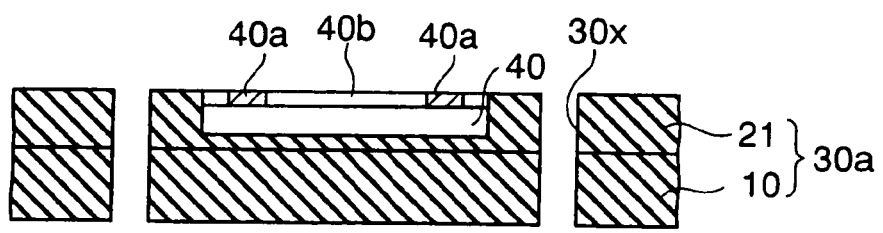
Figure 8D:
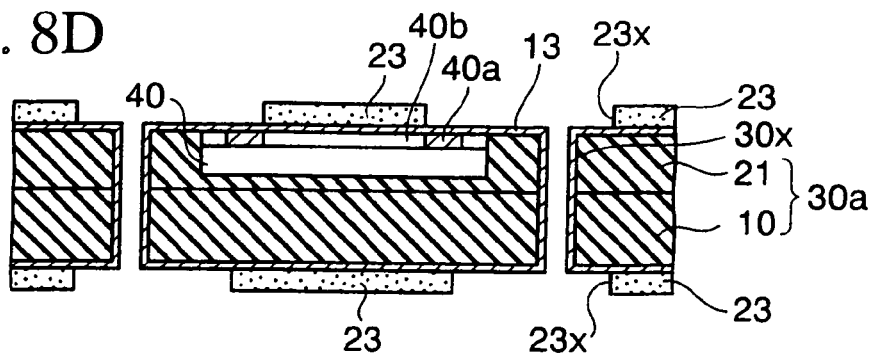
Figure 8E:
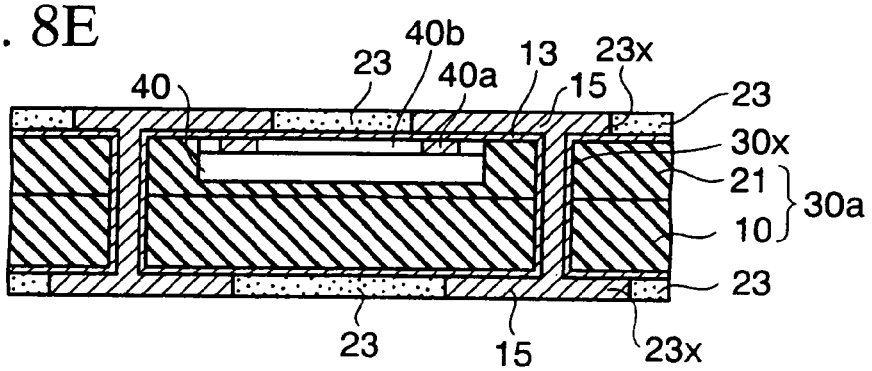
Figure 8F:
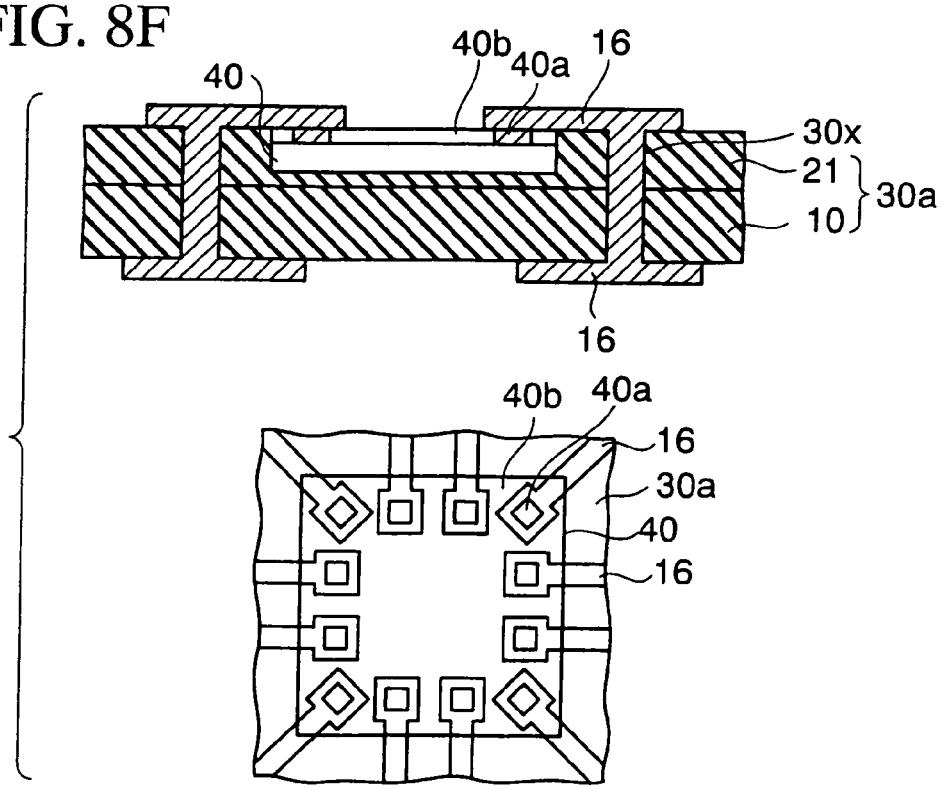
Figure 8G:
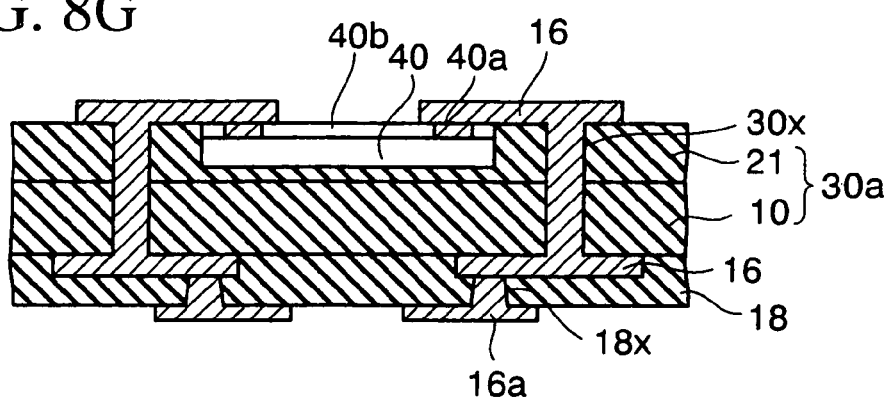
Figure 8H:
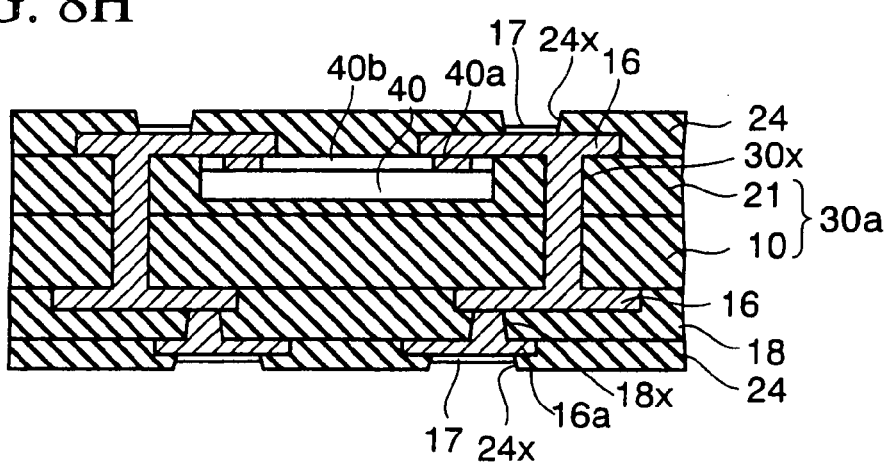
Figure 9:
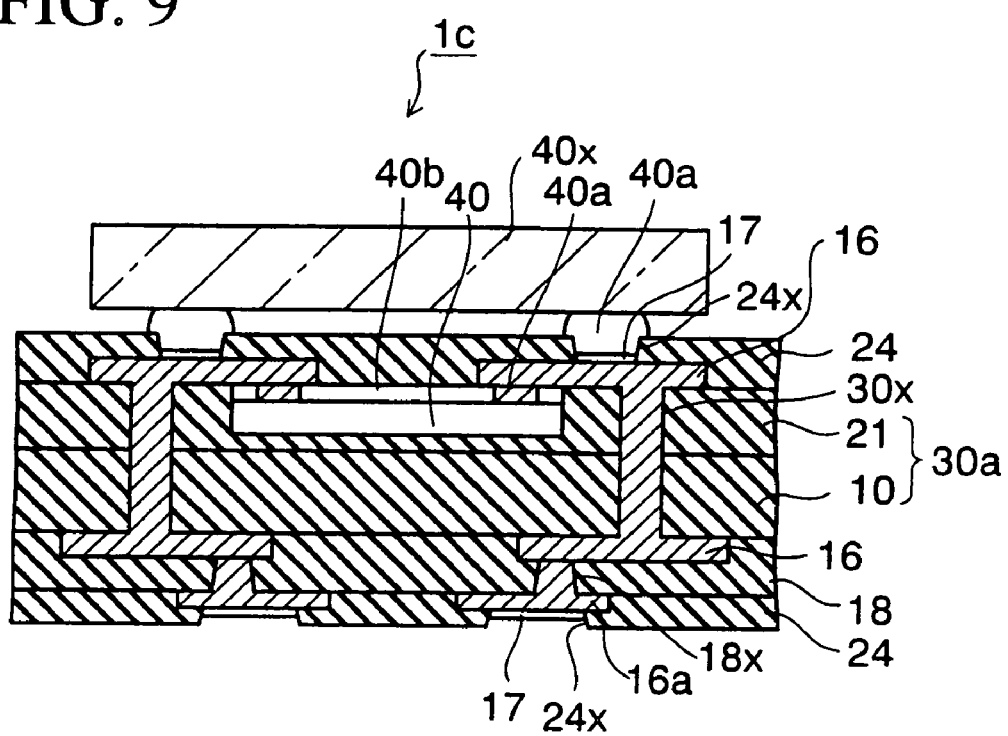
FIG. 9 is a sectional view showing the electronic parts packaging structure according to the third embodiment of the present invention.
Figure 10:
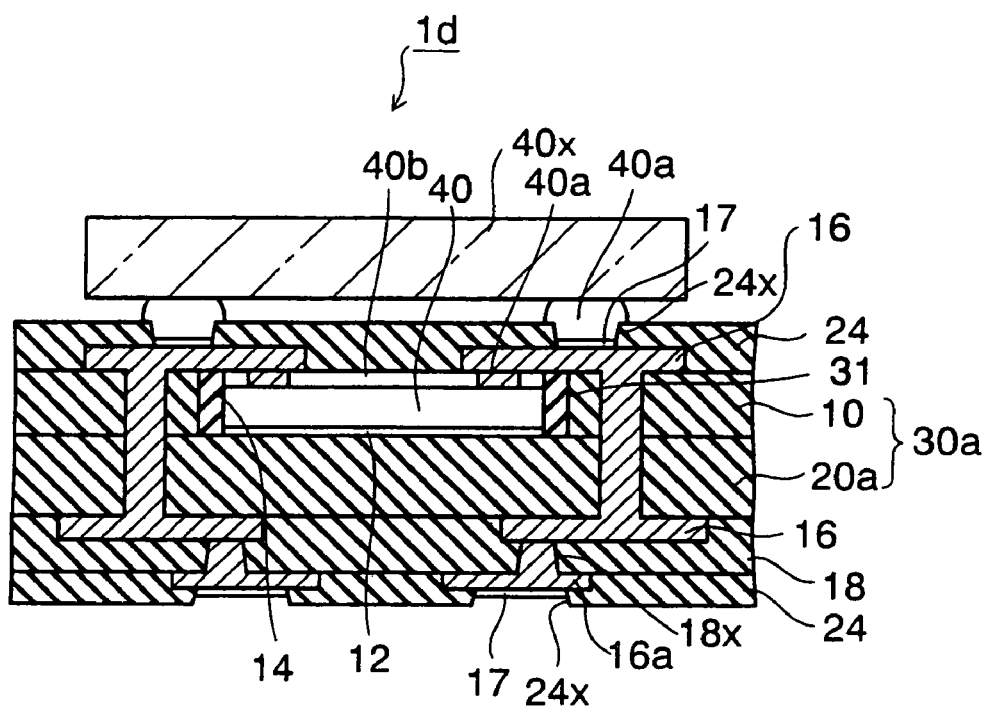
FIG. 10 is a sectional view showing a variation of the electronic parts packaging structure according to the third embodiment of the present invention.

FIGS. 8A to 8H are sectional views showing a method of manufacturing an electronic parts packaging structure according to a third embodiment of the present invention, FIG. 9 is a sectional view showing the electronic parts packaging structure according to the third embodiment of the present invention, and FIG. 10 is a sectional view showing a variation of the same electronic parts packaging structure.

A characteristic feature of the third embodiment resides in that the semiconductor chip including the connection pads that are arranged in the peripheral mode is employed and also the connection pads and the wiring patterns are directly connected without the intervention of the via holes. In the third embodiment, detailed explanation of the similar steps to those in the second embodiment will be omitted herein.

In the method of manufacturing an electronic parts packaging structure in the third embodiment, as shown in FIG. 8A, first the semiconductor chip 40 (electronic parts) in which the connection pads 40a and the passivating films 40b are exposed on the element forming surface is prepared. In the semiconductor chip 40 used in the third embodiment, the connection pads 40a are arranged on the peripheral portion in the peripheral mode. Also, the passivating films 40b is composed of a silicon nitride film and a polyimide film formed thereon, for example.

In addition, the prepreg 10a and the resin layer 21, both being similar to those in the second embodiment, are prepared. Then, according to the similar method to that in the second embodiment, the resin layer 21 is arranged on the prepreg 10a and the semiconductor chip 40 is arranged on the resin layer 21 to direct the connection pads 40a upward. Then, the heat and the pressure are applied by the similar method to that in the second embodiment, so that the resin layer 21 is adhered on the prepreg 10a and the semiconductor chip 40 is embedded in the resin layer 21.

As a result, as shown in FIG. 8B, like the second embodiment, the core substrate 30a composed of the prepreg insulating layer 10 and the resin layer 21 can be obtained and also the semiconductor chip 40 can be embedded in the resin layer 21 of the core substrate 30a to eliminate a level difference of the semiconductor chip 40. Then, as shown in FIG. 8C, the core substrate 30a is processed by the laser, or the like. Thus, the first via holes 30x that pass through the core substrate 30a are formed.

Then, as shown in FIG. 8D, a seed layer 13 is formed on upper and lower surfaces of the core substrate 30a and inner surfaces of the first via holes 30x by the electroless plating. Then, a resist film 23 in which opening portions 23x are provided in portions corresponding to the wiring patterns is formed.

Then, as shown in FIG. 8E, a metal film pattern 15 is formed in the opening portions 23x of the resist film 23 and in the first via holes 30x by the electroplating utilizing the seed layer 13 as the plating power feeding layer. Then, the resist film 23 is removed and then the seed layer 13 is etched by using the metal film pattern 15 as a mask. Thus, as shown in FIG. 8F, the first wiring patterns 16 are formed on both surface sides of the core substrate 30a.

The first wiring patterns 16 formed on the upper surface of the core substrate 30a are connected directly to the connection pads 40a of the semiconductor chip 40 without the intervention of the via holes, and are extended from the connection pads 40a to the outer peripheral portion of the semiconductor chip 40 while contacting the passivating film. In addition, the first wiring patterns 16 formed on the upper surface of the core substrate 30a are connected electrically to the first wiring patterns 16 formed on the lower surface of the core substrate 30a via the first via holes 30x.

In the above second embodiment, the interlayer insulating film 18 for covering the semiconductor chip 40 is formed and then the via holes 18x are formed in the interlayer insulating film 18 on the connection pads 40a of the semiconductor chip 40 by the laser. Therefore, it is supposed in some case that the damage of the semiconductor chip caused when the laser is irradiated onto the connection pads 40b of the semiconductor chip 40 becomes an issue depending on the type of the semiconductor chip 40.

However, in the third embodiment, since the first wiring patterns 16 are connected directly to the connection pads 40a of the semiconductor chip 40 without the intervention of the via holes, there is no possibility of damaging the semiconductor chip 40. Therefore, various electronic parts can be widely used and also a degree of freedom of the packaging operation can be widened.

In addition, as shown in a lower view of FIG. 8F, the first wiring patterns 16 formed on the upper surface of the core substrate 30a are formed to extend from the connection pads 40a, which are arranged in the peripheral mode, of the semiconductor chip 40 to the outer peripheral portion. That is, the first wiring pattern 16 is not arranged in the center portion of the semiconductor chip 40.

Unlike the present embodiment, in case that the connection pads 40a of the semiconductor chip 40 are arranged on the whole surface in the area array mode, the wiring patterns are also arranged in the center portion of the semiconductor chip 40. Therefore, in the case that the film having the low insulation resistance is used as the passivating films 40b of the semiconductor chip 40, it is assumed that the wiring patterns and the electric circuits of the semiconductor chip 40 are short-circuited electrically. For this reason, it is assumed that a protection film having the high insulation resistance must be patterned once again on the passivating films 40b.

However, in the present embodiment, the first wiring patterns 16 are formed to extend from the connection pads 40a, which are arranged in the peripheral mode, of the semiconductor chip 40 to the outer peripheral portion. Therefore, there is no possibility that the wiring patterns and the electric circuits of the semiconductor chip 40 are short-circuited electrically. This is because no electric circuit is present in the area of the semiconductor chip 40, which is located under the outside of the connection pads 40a that are arranged in the peripheral mode.

With this arrangement, since the steps of forming the interlayer insulating film and the via holes after the semiconductor chip 40 is mounted can be omitted, a cost reduction can be achieved much more than the first embodiment.

Then, as shown in FIG. 8G, the interlayer insulating film 18 for covering the first wiring patterns 16 on the lower surface side of the core substrate 30a is formed, and then the second via holes 18x are formed in portions of the interlayer insulating film 18 on the first wiring patterns 16. Then, the second wiring patterns 16a each connected to the first wiring pattern 16 via the second via hole 18x are formed on the interlayer insulating film 18 on the lower surface side of the core substrate 30a.

In this case, in the present embodiment, such a mode is illustrated that a single-layer wiring patterns 16 are formed on the upper surface side of the core substrate 30a and two-layered wiring patterns 16, 16a are formed on the lower surface side of the core substrate 30a. But such a mode may be employed that n-layered (n is an integer that is 1 or more) wiring patterns are stacked on both surface sides of the core substrate 30a respectively.

Then, as shown in FIG. 8H, the solder resist film 24 in which the opening portions 24x are provided on the first wiring patterns 16 on the upper surface side of the core substrate 30a and the second wiring patterns 16a on the lower surface side thereof respectively is formed on both surface sides of the core substrate 30a respectively. Then, the connection portions 17 are formed by applying the Ni/Au plating to portions of the first and second wiring patterns 16, 16a in the opening portions 24x of the solder resist film 24 on both surface sides of the core substrate 30a respectively.

Then, as shown in FIG. 9, the bumps 40a of the upper semiconductor chip 40x are flip-chip connected to the connection portions 17 on the first wiring patterns 16 over the core substrate 30a. Thus, an electronic parts packaging structure 1c in the third embodiment is obtained. Then, as in the first embodiment, the connection portions 17 on the first wiring patterns 16 under the core substrate 30a serve as the external connection pads.

In the electronic parts packaging structure 1c in the third embodiment, like the second embodiment, as shown in FIG. 9, the semiconductor chip 40 is embedded in the resin layer 21 of the core substrate 30a that is composed of the prepreg insulating layer 10 and the resin layer 21, and thus the thickness of the semiconductor chip 40 is contained in the core substrate 30a and eliminated.

The via holes 30x that pass through the core substrate are provided in the core substrate 30a, and also the first wiring patterns 16 that are connected mutually via the via holes 30x are formed on both surface sides of the core substrate 30a respectively. The first wiring patterns 16 formed on the upper surface side of the core substrate 30a are connected directly to the connection pads 40a, which are arrange in the peripheral mode, of the semiconductor chip 40 without the intervention of the via holes, and are formed to contact the passivating film 40b. The first wiring patterns 16 are not formed on the center portion of the semiconductor chip 40, but they are formed to extend from the connection pads 40a to the outer peripheral portion of the semiconductor chip 40.

The solder resist film 24 in which the opening portions 24x are provided on the predetermined portions of the first wiring patterns 16 on the upper surface side of the core substrate 30a is formed, and the connection portion 17 is formed in the opening portions 24x. Then, the bumps 40a of the upper semiconductor chip 40x (upper electronic parts) are flip-chip connected to the connection portions 17.

The interlayer insulating film 18 in which the second via holes 18x are formed on the first wiring patterns 16 on the lower surface side of the core substrate 30a is formed, and the second wiring patterns 16a each connected to the first wiring pattern 16 via the second via hole 18x are formed thereon. In addition, the solder resist film 24 in which the opening portions 24x are provided on the predetermined portions of the second wiring patterns 16a is formed, and the connection portion 17 for the external connection is provided in the opening portions 24x.

In the electronic parts packaging structure 1c in the third embodiment, like the second embodiment, since the semiconductor chip 40 is embedded in the resin layer 21 of the core substrate 30a, the thickness of the semiconductor chip 40 can be eliminated. Thus, the electronic parts packaging structure 1c can deal easily with the thickness reduction of the packaging structure.

Further, the first wiring patterns 16 are connected to the connection pads 40a, which are arranged in the peripheral mode, of the semiconductor chip 40 without the intervention of the via holes, and are formed to extend to the outer peripheral portion of the semiconductor chip 40. Therefore, for the above reason, there is no necessity to particularly pattern the protection film with a high insulating performance on the semiconductor chip 40. In addition, there is no possibility that the semiconductor chip 40 suffers damage by the laser in the manufacturing step. As a result, various electronic parts can be employed and also the reliability of the electronic parts packaging structure can be improved.

Then, as shown in FIG. 10, like an electronic parts packaging structure 1d according to a variation of the third embodiment, the core substrate 30 in which the recess portion 31 is provided, as explained in the first embodiment, may be employed in place of the core substrate 30a in which the semiconductor chip 40 is embedded in the resin layer 21, and then the electronic parts 40 may be secured in the recess portion 31 by the adhesive layer 12. In FIG. 10, since the remaining elements are identical to those in FIG. 9, their explanation will be omitted herein.

What is claimed is:

1. An electronic part packaging structure comprising:
 a core substrate composed of a resin layer and a prepreg insulating layer formed on the resin layer to have an opening portion which passes through from an upper surface of the prepreg insulating layer to a lower surface thereof, whereby a recess portion is provided by the opening portion in the prepreg insulating layer; and
 an electronic part mounted on the resin layer in the recess portion of the core substrate such that a connection pad of the electronic part is directed upward,
 a lower wiring pattern formed on a lower surface of the resin layer of the core substrate, and electrically connected to the connection pad of the electronic part; and
 an upper wiring pattern connected electrically to a connection pad of the electronic part formed on or over the core substrate and the electronic part, and
 wherein the upper wiring pattern is constructed in an n-layered (n is an integer that is 1 or more) fashion, an external connection portion on which an external connection terminal is provided is defined in a portion, which is out of the electronic part, of the uppermost wiring pattern in the upper wiring pattern, and an upper electronic part is flip-chip connected to the external connection terminal on the uppermost said upper wiring pattern.

2. An electronic part packaging structure, according to claim 1, wherein the lower wiring layer contacts the lower surface of the resin layer, and is formed of a copper foil.

3. An electronic part packaging structure, according to claim 1, wherein the upper wiring layer is formed directly to contact an upper surface of the prepreg insulating layer and a connection pad formation surface of the connection pad side in the electronic part.

* * * * *